(12) United States Patent
Noda

(10) Patent No.: US 6,529,024 B2
(45) Date of Patent: Mar. 4, 2003

(54) PROBE STYLUS

(75) Inventor: Hiroshi Noda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/131,181

(22) Filed: Apr. 25, 2002

(65) Prior Publication Data

US 2002/0113609 A1 Aug. 22, 2002

Related U.S. Application Data

(62) Division of application No. 09/330,155, filed on Jun. 11, 1999, now Pat. No. 6,404,213.

(30) Foreign Application Priority Data

Jan. 19, 1999 (JP) ............................................. 11-11208

(51) Int. Cl.[7] .......................... G01R 31/02; G01R 31/26
(52) U.S. Cl. ....................... 324/754; 324/757; 324/761; 324/72.5
(58) Field of Search ................................ 324/754, 758, 324/149, 761, 762, 72.5, 756, 765, 757

(56) References Cited

U.S. PATENT DOCUMENTS

| | | | |
|---|---|---|---|
| 4,423,373 A | * 12/1983 | LeCroy, Jr. ................. | 324/72.5 |
| 4,894,612 A | * 1/1990 | Drake et al. ............... | 324/72.5 |
| 5,006,809 A | * 4/1991 | Mang et al. ................ | 324/603 |
| 5,334,931 A | * 8/1994 | Clarke et al. ............... | 324/757 |
| 6,023,171 A | * 2/2000 | Boyette et al. ............. | 324/754 |
| 6,127,832 A | * 10/2000 | Comulada et al. .......... | 324/754 |
| 6,404,213 B2 | * 6/2002 | Noda ........................ | 324/72.5 |

FOREIGN PATENT DOCUMENTS

| | | |
|---|---|---|
| JP | 5-144895 | 6/1983 |
| JP | 61-104380 | 7/1986 |
| JP | 1-132975 | 9/1989 |
| JP | 1-174932 | 12/1989 |
| JP | 2-124469 | 5/1990 |
| JP | 4-288847 | 10/1992 |

* cited by examiner

Primary Examiner—Christine Oda
Assistant Examiner—Anjan K. Deb
(74) Attorney, Agent, or Firm—Burns, Doane, Swecker & Mathis, LLP

(57) ABSTRACT

The present invention relates to a probe stylus 1 for an inspection of semiconductor device in a state of wafer. When a large number of pad 5 are disposed in a semiconductor device, setting of the probe styluses 1 onto a probe card, on which a semiconductor to be inspected shall be mounted, is difficult. An object of the present invention is to improve the form of the probe stylus to solve this problem. The object is attained by a probe stylus according to the present invention. The probe stylus 1 has a first electrically conductive member 2, a second electrically conductive member 3, and an insulating member 4 disposed between the first and second electrically conductive members 2,3. The first and second electrically conductive members 2,3 have a form of a needle and they form a single needle. In an embodiment, the first and second electrically conductive members have a half round cross section. In another embodiment, each of the first and second electrically conductive members has a resilient portion at their tip portion. In another embodiment, the first electrically conductive member is covered with the insulating member, and the insulating member is covered with the second electrically conductive member. In further another embodiment, a slit is disposed between the first and second electrically conductive members.

2 Claims, 20 Drawing Sheets

FIG. 65(a)
(PRIOR ART)
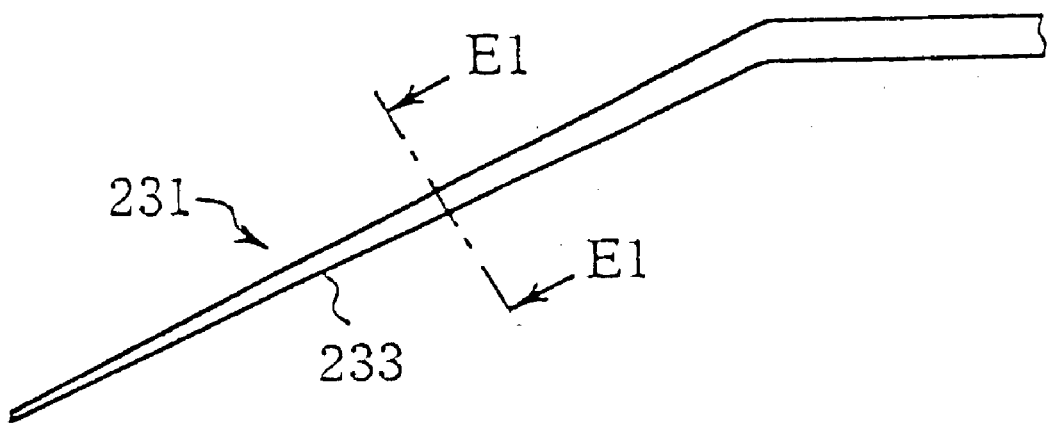
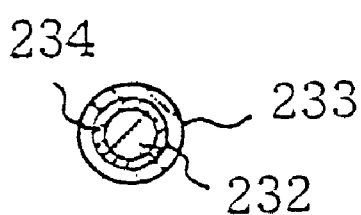
FIG. 65(b)
(PRIOR ART)

PROBE STYLUS

This application is a division of U.S. application Ser. No. 09/330,155 filed Jun. 11, 1999 now U.S. Pat. No. 6,404,213.

BACKGROUND OF THE INVENTION

1. Field of the Invention

The present invention relates to a probe stylus for inspecting a semiconductor at a wafer state.

2. Description of the Prior Art

A probe stylus in the prior art is constituted by a single electrically conductive needle. In a high precision inspection of a semiconductor device at a wafer state, a probe styluses for applying force and probe styluses for sensing are connected to pads disposed in a semiconductor. These probe styluses are connected to form a Kelvin connection. In such probe styluses, a cantilever type probe stylus and a perpendicular type probe stylus are known. The cantilever type probe stylus contacts obliquely With a pad disposed in a semiconductor device, and the perpendicular type probe stylus contacts perpendicularly with a pad, at an inspection of a semiconductor.

During an inspection of an I/O of a semiconductor device, for example, a high speed logic element, when an output data of a driver of a tester is inputted into a signal input terminal of a semiconductor, and the output from the output terminal of the semiconductor is received by a comparator of the tester, there is case that a dead band appears. For eliminating such a dead band, it is proposed to use a signal line specialized for transferring the data signal from the output terminal of the tester to the input terminal of the semiconductor and another signal line specialized for transferring the signal from the output terminal of the semiconductor to the comparator of the tester. A dead band means a period in which the tester cannot judge the semiconductor because of a conflict of the signals from the output terminal of the semiconductor and the data signal from the output terminal of the driver of the tester.

Many probe styluses are already known, which allows precise inspection of a semiconductor device at a wafer state, even when a large number of pads are disposed in the semiconductor device. Such probe styluses are disclosed, for example, in Japanese Patent Applications JP-A-5-144895, JP-Utility-Model-A-1-174932, JP-A-Utility-Model-61-104380, JP-A-2-124469 and JP-A-4-288847.

FIG. 62 is a perspective view of a probe stylus disclosed in JP-A-5144895. FIG. 62 shows a state that a probe stylus 201 contacts a pad 204 disposed in a semiconductor. The probe stylus 201 is a so-called cantilever type probe stylus constituted by a first electrically conductive member 202 and a second electrically conductive member 203, which are joined to each other so as to form a branching structure.

FIG. 63 is a cross sectional view of a probe stylus disclosed in JP-Utility-Model-A-1-174932. FIG. 63 shows that a probe stylus 211 contacts with a pad 216 disposed in a semiconductor. The probe stylus 211 is a so-called perpendicular type probe stylus constituted by a first electrically conductive member 212, a second electrically conductive member 203 and an insulating member 214 disposed between the first and second probe stylus. The first and second electrically conductive members 212, 213, have a form of a conventional perpendicular type probe stylus. The first and second electrically conductive members 212, 213 and the insulating member 214 are adhered to each other by an adhesive 215.

FIG. 64 is a cross sectional view of a probe stylus disclosed in JP-Utility-Model-A-61-104380. FIG. 64 shows that a probe stylus 221 contacts a pad disposed in a semiconductor. The probe stylus 221 is a so-called cantilever type probe stylus constituted of a first electrically conductive member 222, a second electrically conductive member 223, and insulating member 224 disposed between and around the first and second electrically conductive members 222, 223. The first electrically conductive member 222 has a form of a conventional cantilever type probe stylus. The second electrically conductive member 223 is thinner than the first electrically conductive member 222. The first and second electrically conductive members 222, 223 are fixed to each other by the insulating member 224 so that they form a single body.

FIG. 65(a) is a side view of a probe stylus disclosed in JP-A-2-124469, FIG. 65(b) is a E1—E1 cross sectional view of FIG. 65(a). The probe stylus 231 is a so-called cantilever type probe stylus constituted of a first electrically conductive member for providing force 232, a second electrically conductive member for sensing 233, and an insulating member 234 disposed between the first and second electrically conductive members 232, 233. The first electrically conductive member for producing force 232 has a form of a conventional cantilever type probe stylus. The outside of the first electrically conductive member 232 is covered with the insulating member 234, and the outside of the insulating member 234, in turn, is covered with the second electrically conductive members 233.

Also, JP-A-4-288847 discloses a similar probe stylus constituted of a first electrically conductive member for providing force 232, which has a form of a conventional cantilever type probe stylus and is covered with an insulating member 234, and a second electrically conductive member for sensing 233, which covers the outside of the insulating member 234.

The probe stylus of the prior art, constituted as a single electrically conductive needle, has following drawbacks. In general, a large number of probe styluses are required for high precision inspection of a semiconductor in a wafer state when a large number of pads is disposed in the semiconductor device. However, the setting of the probe styluses of the prior art onto a probe card is difficult when a large number of pads are disposed in a semiconductor device.

Another drawback is that a probe card tends to warp, when perpendicular type probe styluses contact with the pads disposed in a semiconductor device.

SUMMARY OF THE INVENTION

An object of the present invention is to eliminate these drawbacks of the probe stylus of the prior art.

Another object is to propose a probe stylus, which allows precise inspection of a semiconductor at a wafer state, even when a large number of the pads are disposed in a semiconductor device.

Another object is to propose a probe stylus which does not cause a warp of the probe card when the probe styluses contact the pads, even when a large number of pads are disposed in a semiconductor device.

The object is attained by a probe stylus according to claim 1.

In an embodiment the probe stylus of the present invention, the cross section of each of the first and second electrically conductive members perpendicular to their longitudinal direction is a half round.

In another embodiment the probe stylus of the present invention, each of the first and second electrically conductive members has a resilient portion at their tip portion, where the probe stylus contacts with a pad disposed in a semiconductor device.

In another embodiment the probe stylus of the present invention, the first electrically conductive member is covered with the insulating member, and the insulating member is covered with the second electrically conductive member, and the first and second electrically conductive members are electrically connected to each other at their tip portion.

In another embodiment the probe stylus of the present invention, the first electrically conductive member is covered with the insulating member, and the insulating member is covered with the second electrically insulating member, and the first and second electrically conductive members are not electrically connected to each other at their tip portion, but are connected to each other through a pad disposed in a semiconductor device at an inspection of the semiconductor device.

In another embodiment the probe stylus of the present invention, the first electrically conductive member is covered with the insulating member, and the insulating member is covered with the second electrically conductive member, and the first and second electrically conductive members are not electrically connected to each other at their tip portion, but are connected to each other through a pad disposed in a semiconductor device at an inspection of the semiconductor device.

BRIEF DESCRIPTION OF THE DRAWINGS

FIG. 65(*a*) is a side view of a probe stylus disclosed in JP-A-61-104380, FIG. 65(*b*) is a E1—E1 cross sectional view of FIG. 65(*a*).

DETAILED DESCRIPTION OF THE PREFERRED EMBODIMENTS

FIRST EMBODIMENT

Figure 1:
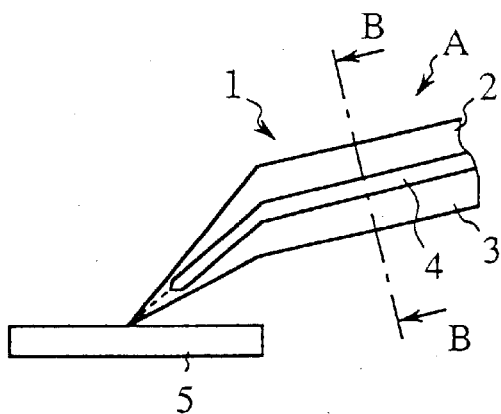
FIG. 1 is a schematic side view of a probe stylus as a first embodiment of the present invention.
Figure 2:
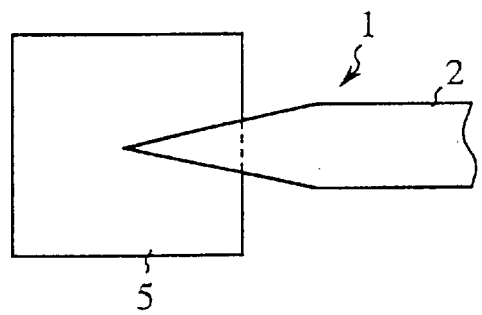
FIG. 2 is a plan view of the probe stylus seen from the side A in FIG. 1.
Figure 3:
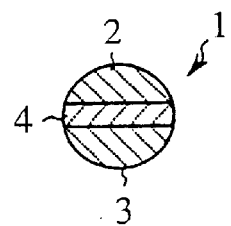
FIG. 3 is a cross sectional view of the probe stylus along B—B line in FIG. 1.

The first embodiment of the probe stylus according to the present invention is explained below, referring to FIG. 1—6. FIGS. 1 and 2 show the probe stylus 1 contacting a pad 5 disposed in a semiconductor device.

The probe stylus 1 of the first embodiment of the present invention is a so-called cantilever type probe stylus. Each of the first and second electrically conductive members 2,3 has a form of a needle. The cross section perpendicular to the longitudinal direction of the needle is half round. Namely, each of the first and second electrically conductive member has a form of a conventional cantilever type probe stylus but divided equally along its longitudinal axis. Thus, the assembly of the probe stylus of the first embodiment has a thickness substantially equal to the conventional probe stylus. The first and second electrically conductive members 2, 3 are electrically connected to each other at their tip, where the probe stylus 1 contacts a pad 5 disposed in a semiconductor device, and are physically connected by an insulator 4 elsewhere so that the first and second electrically conductive members 2, 3 and the insulating member 4 form a single needle. In this embodiment, the first and second electrically conductive members 2, 3 are arranged so that one of them is positioned over the other.

Figure 4:
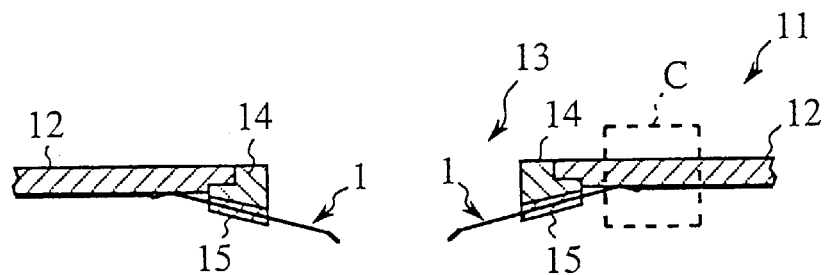
FIG. 4 is a cross sectional view of a probe card having probe styluses according to the first embodiment of the present invention.
Figure 5:
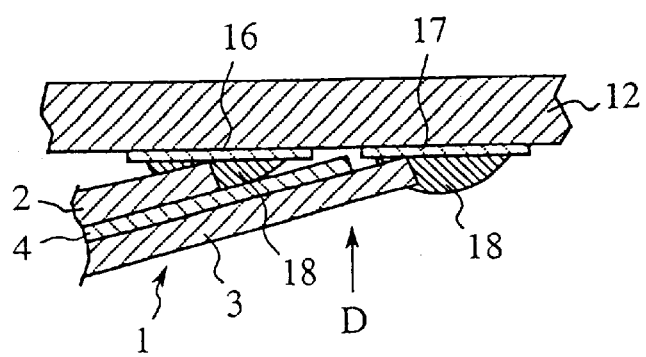
FIG. 5 is a detailed cross sectional view of the a connecting portion of a probe stylus and the probe card of FIG. 4.
Figure 6:
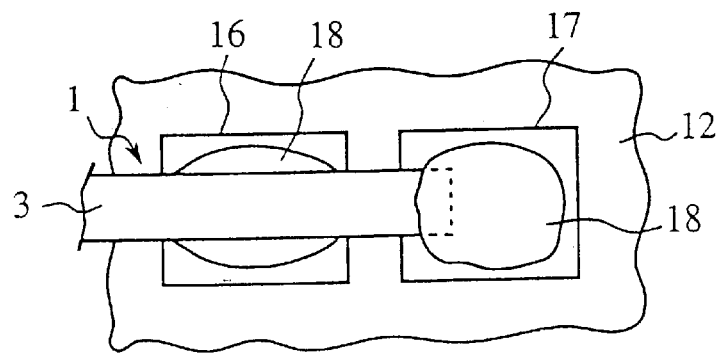
FIG. 6 is a plan view of the connecting portion of a probe stylus and the probe card seen from the side D in FIG. 5.

Referring to FIG. 4, a base substrate 12 of the probe card 11 has a center hole 13, and a probe stylus 1 is fixed to a ring 14 by a synthetic resin 15. FIG. 5 shows a detailed cross sectional view of the part C in FIG. 4 framed by a broken line. FIG. 6 is a plan view of the connecting portion of a probe stylus and the probe card seen from the side D in FIG. 5. Referring to FIG. 6, first and second lands 16, 17 are disposed on the base substrate 12 of the probe card 1. The first electrically conductive member 2 contacts a first land 16, the second electrically conductive member 3 contacts a second land 17. Reference numeral 18 denotes soldering portion connecting the first and second electrically conductive members 2, 3 with the first and second land 16, 17, respectively. The structure of the other parts are similar to that shown in FIGS. 1, 4.

The function of the probe card and the probe stylus is explained below.

At a precise inspection of a semiconductor device at a wafer state, a probe stylus 1 is brought in contact with a pad 5 disposed in a semiconductor device. One of the first and second electrically conductive member 2, 3 is used as an electrically conductive member for providing force, and the other is used as an electrically conducting member for sensing. In this case, the first and second electrically conductive members are connected at their tip; therefore, the value of voltage and/or electric current can be compensated up to the tip of the probe stylus 1, when a Kelvin connection is formed at the tips of the first and second electrically conductive member 2, 3.

At an inspection of an I/O of a semiconductor device at a wafer state, the probe stylus 1 is brought in contact with a pad 5 disposed in the semiconductor device, and one of the first and second electrically conductive members 2, 3 is used as an electrically conductive member for driving and the other is used as an electrically conductive member for tester. In this case, the first and second electrically conductive members are electrically connected to each other at their tip. Therefore, the line specialized for transferring output data signal from the driver to the pad 5 disposed in the semiconductor device, and the line specialized for transferring the output data signal from the pad 5 to the comparator of the tester are assured up to the tip of the probe stylus.

As explained, the probe stylus 1 according to the first embodiment of the present invention has a first electrically conductive member 2 and a second electrically conductive member 3. Therefore, such a probe stylus functions as an equivalent to two probe styluses of the prior art. As a result, by contacting one probe stylus to one of the pads disposed in a semiconductor device, it is possible to eliminate so-called dead band in the comparator in a precise inspection of a semiconductor device at a wafer state, or in an inspection of an I/O of a semiconductor device at a wafer state. Also in a case that a large number of pads are disposed in a semiconductor device, corresponding large number of probe styluses can be disposed on a probe card, so that so-called dead band in the comparator can be eliminated in such a precise inspection of a semiconductor device at a wafer state, or in an inspection of an I/O of a semiconductor device at a wafer state.

A probe stylus according to the first embodiment of the present invention functions equivalently to two probe styluses of the prior art. Hence, the number of probe styluses 1 to be attached to a probe card and/or the area required for the arrangement of the probe stylus in a probe card can be reduced. As a result, the fabrication cost can be reduced.

Additionally, according to the first embodiment of the present invention, each of the first and second electrically conductive members has a half round cross section perpendicular to the longitudinal direction. Therefore, the thickness of the probe stylus according to the first embodiment is smaller than that of bundled two probe styluses of the prior art. As a result, also in a case that a large number of pads are disposed in a semiconductor device, a corresponding number of the probe styluses 1 can be attached onto a probe card.

SECOND EMBODIMENT

In a probe stylus according to the first embodiment, the first and second electrically conductive members 2, 3 are connected at their tip. On the other hand, in a probe stylus according to the second embodiment of the present invention, the first and second electrically conductive members are not connected at their tip. During an inspection of a semiconductor device, they are connected to each other through a pad disposed in a semiconductor device. The other features are similar to that of the first embodiment.

Figure 7:
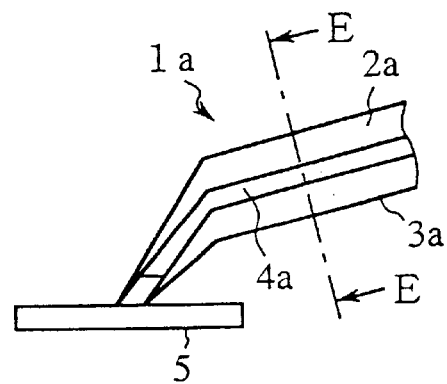
FIG. 7 is a schematic side view of a probe stylus as a second embodiment of,the present invention.
Figure 8:
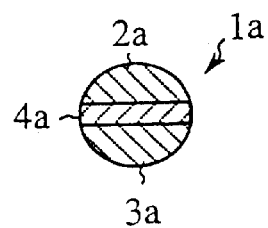
FIG. 8 is a cross sectional view of the probe stylus along E—E line in FIG. 7.

FIGS. 7 shows that the probe stylus 1a in contact with a pad 5 disposed in a semiconductor device. Referring to the figure, reference numerals 1a, 2a, 3a denote a probe stylus, a first electrically conductive member, and a second electrically conductive member, respectively. The first and second electrically conductive members 2a, 3a are connected by an insulating member 4a arranged between them. Reference numeral 5 denotes a pad disposed in a semiconductor.

The structure of a probe card having probe stylus 1a according to the second embodiment is similar to that of the probe card shown in FIG. 4. The connection between a probe stylus 1a and the substrate of a probe card is similar to that shown in FIGS. 5, 6.

The function of the probe card and the probe stylus is explained below.

At a precise inspection of a semiconductor device at a wafer state, a probe stylus 1a is brought in contact with a pad 5 disposed in the semiconductor device. And one of the first and second electrically conductive member 2a, 3a is used as an electrically conductive member for forcing, and the other is used as an electrically conducting member for sensing. In this case, the first and second electrically conductive members connects electrically through the pad 5, therefore, the value of voltage and/or electric current can be compensated up to the pad 5, when a Kelvin connection are formed on the pad 5.

At an inspection of an I/O of a semiconductor device at a wafer state, the probe stylus 1a is brought in contact with a pad 5 disposed in the semiconductor device, and one of the first and second electrically conductive member 2a, 3a is used as an electrically conductive member for driving and the other is used as an electrically conductive member for tester. In this case, the first and second electrically conductive member 2a, 3a contact electrically to each other through the pad 5. Therefore, a line specialized for transferring output data signal from the driver to the pad 5 disposed in the semiconductor device (hereinafter referred to "a line for driver"), and a line specialized for transferring the output data signal from the pad 5 to the comparator of the tester (hereinafter referred to "a line for comparator) are assured up to the pad 5.

As explained, the first and second electrically conductive members 2a, 3a in the probe stylus according to the second embodiment contact electrically to each other through a pad 5 disposed in the semiconductor at an inspection of a semiconductor device. Therefore, the value of voltage and/or electric current can be compensated up to the pad 5, at a precise inspection of a semiconductor device at a wafer state. And a line for driver and a line for comparator are assured up to the pad 5, at an inspection of an I/O of a semiconductor device at a wafer state. As a result, a higher precision inspection of a semiconductor device is possible.

A probe stylus according to the second embodiment has similar advantages to that of a probe stylus according to the first embodiment.

THIRD EMBODIMENT

The first and second electrically conductive members 2,3 in a probe stylus according to the first embodiment are so arranged that one of them is positioned over the other. On the other hand, the first and second electrically conductive members in a probe stylus according to the third embodiment are arranged side by side. The other features of a probe stylus according to the third embodiment are similar to that of the first embodiment.

Figure 9:
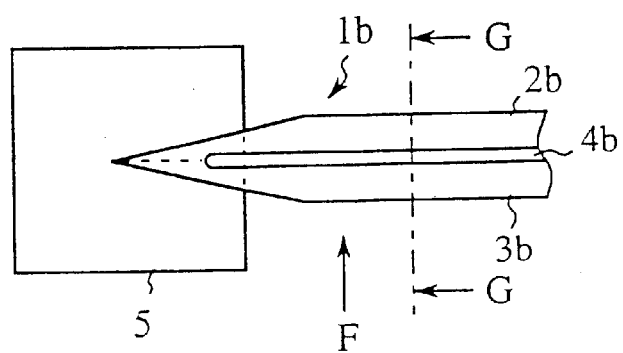
FIG. 9 is a plan view of a probe stylus as a third embodiment of the present invention.
Figure 10:
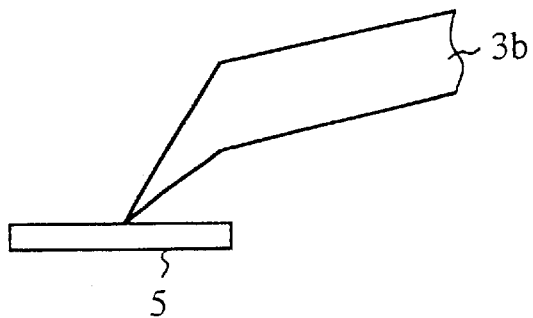
FIG. 10 is a side view of the probe stylus seen from the side F in FIG. 9.
Figure 11:
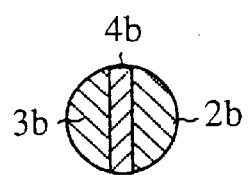
FIG. 11 is a cross sectional view of the probe stylus along G—G line in FIG. 11.

FIGS. 9 and 10 show that a probe stylus 1b contacts with a pad 5 disposed in a semiconductor device. Referring to the figures, reference numerals 1b, 2b, 3b denote a probe stylus, a first electrically conductive member, and a second electrically conductive member, respectively. The first and second electrically conductive members 2b, 3b are connected by an insulating member 4b arranged between them. Reference numeral 5 denotes a pad disposed in a semiconductor.

Figure 12:
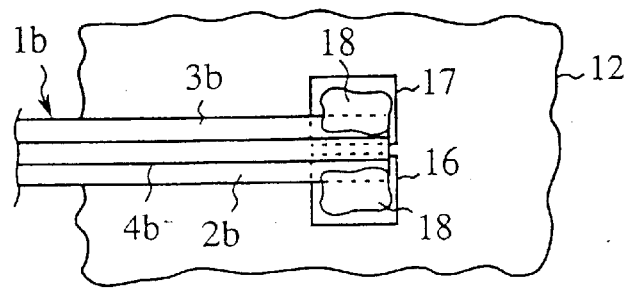
FIG. 12 is a plan view of the connecting portion of a probe stylus according to the third embodiment and a probe card seen from the bottom side.

The structure of a probe card having probe stylus 1b according to the third embodiment is similar to that of the probe card shown in FIG. 4. FIG. 12 corresponds to FIG. 6. An element in FIG. 12 corresponding to an element in FIGS. 6, 9 are referred by the same reference numeral. The function of each element of a probe stylus according to the third embodiment is similar to that of a probe stylus according to the first embodiment.

Because the first and second electrically conductive members 2b, 3b of the probe stylus according to the third embodiment are arranged side by side, a force urges them equally, when the probe stylus 1b contacts with a pad 5 disposed in a semiconductor. As a result, the structural reliability of the probe stylus is improved.

A probe stylus according to the third embodiment has similar advantages to that of a probe stylus according to the first embodiment.

FOURTH EMBODIMENT

In a probe stylus according to the third embodiment, the first and second electrically conductive members 2b, 3b are connected at their tip. On the other hand, in a probe stylus according to the fourth embodiment of the present invention, the first and second electrically conductive members are not connected at their tip. And at an inspection of a semiconductor device, they are connected to each other through a pad disposed in the semiconductor device. The other feature is similar to that of the third embodiment.

Figure 13:
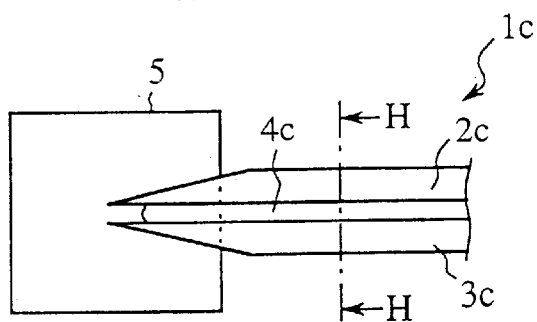
FIG. 13 is a plan view of a probe stylus according to the fourth embodiment.
Figure 14:
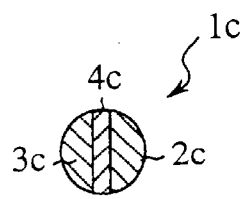
FIG. 14 is a cross sectional view of the probe stylus along H—H line in FIG. 13.

FIG. 13 shows that the probe stylus 1c is contacting with a pad 5 disposed in a semiconductor device. Referring to the figures, reference numerals 1c, 2c, 3c denote a probe stylus, a first electrically conductive member, and a second electrically conductive member, respectively. The first and second electrically conductive members 2c, 3c are connected by an insulating member 4c arranged between them. Reference numeral 5 denotes a pad disposed in a semiconductor.

The structure of a probe card having probe stylus 1c according to the fourth embodiment is similar to that of the probe card shown in FIG. 4. The connection between a probe stylus 1c and the substrate of a probe card is similar to that shown in FIG. 12. The function of the probe stylus according to the fourth embodiment is similar to that of second embodiment.

As explained, the first and second electrically conductive members 2c, 3c in the probe stylus according to the fourth embodiment contact electrically to each other through a pad 5 disposed in the semiconductor at an inspection of a semiconductor device. Therefore, the value of voltage and/or electric current can be compensated up to the pad 5, at a precise inspection of a semiconductor device at a wafer state. And a line for driver and a line for comparator are assured up to the pad 5, at an inspection of an I/O of a semiconductor device at a wafer state. As a result, a higher precision inspection of a semiconductor device becomes possible.

A probe stylus according to the fourth embodiment has similar advantages to that of a probe stylus according to the third embodiment.

FIFTH EMBODIMENT

Figure 15:
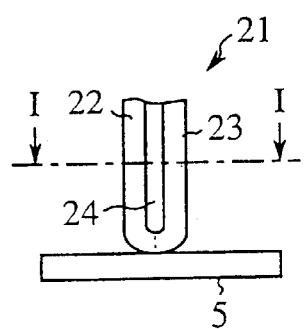
FIG. 15 is a schematic side view of a probe stylus as embodiment of the present invention.
Figure 16:
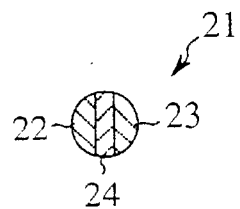
FIG. 16 is a cross sectional view of the probe stylus along I—I line in FIG. 15.

FIG. 15 shows that the probe stylus 21 is contacting with a pad 5 disposed in a semiconductor device. Referring to the figure, reference numerals 21, 22, 23 denote a probe stylus, a first electrically conductive member, and a second electrically conductive member, respectively. The first and second electrically conductive members 22, 23 are connected by an insulating member 24 arranged between them. Reference numeral 5 denotes a pad disposed in a semiconductor device.

The probe stylus 21 of the fifth embodiment of the present invention is a so-called perpendicular type probe stylus. Each of the first and second electrically conductive members 22, 23 has a form of needle. The cross section perpendicular to the longitudinal direction of the needle is half round. Namely, each of the first and second electrically conductive member 22, 23 has a form of a conventional perpendicular type probe stylus divided equally along its longitudinal axis. Thus, the assembly of the probe stylus of the fifth embodiment has a thickness substantially equal to the conventional perpendicular type probe stylus. The first and second electrically conductive members 22, 23 are connected to each other at their tip, where the probe stylus 21 contacts with a pad 5 disposed in a semiconductor device.

Figure 17:
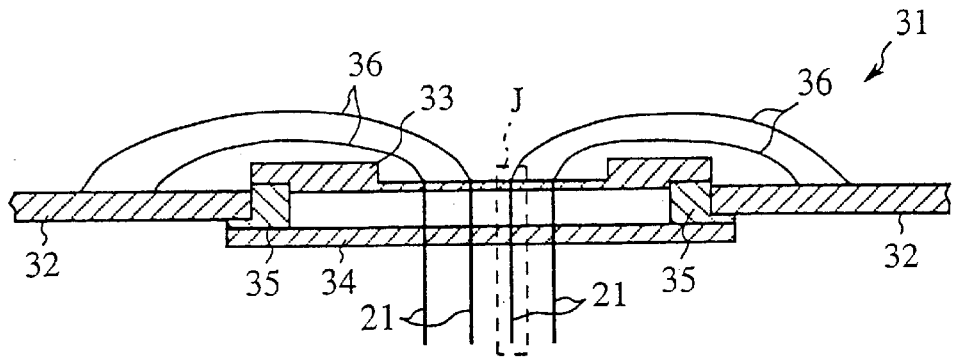
FIG. 17 is a cross sectional views of a probe card having probe styluses according to the fifth embodiment of the present invention.
Figure 18:
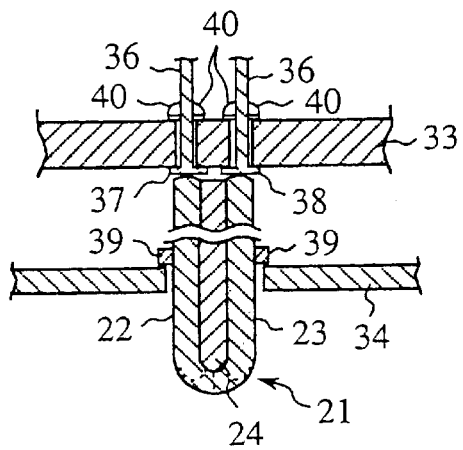
FIG. 18 is a detailed cross sectional view of the probe card at the connecting portion of a probe card and a probe stylus according to the fifth embodiment, showing an example of the connection between them.

Referring to FIG. 17, probe card 31 comprises a first substrate 32, a second substrate 33, a third substrate 34, a ring 35 and wiring 36. FIG. 18 shows a detailed cross sectional view of the part J framed by a broken line in FIG. 17. As shown in FIG. 18, a first land 37, a second land 38 are formed at the second substrate 33. And a fixing ring 39 fixes the probe stylus 21 to the third substrate 34. The wiring 36 is fixed to the second substrate 33 by a soldering 40. The structure of other elements is similar to that of the elements referred by the same reference numeral in FIGS. 15 and 17.

Figure 19:
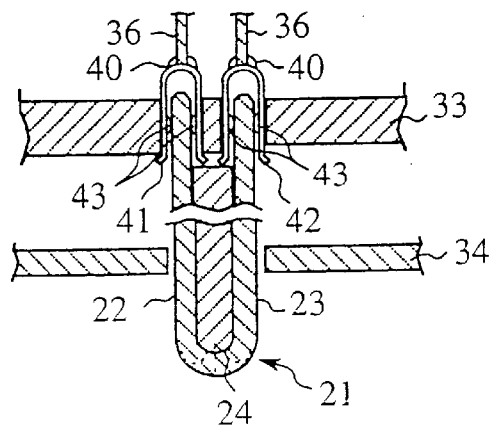
FIG. 19 a detailed cross sectional view of the probe card at the connecting portion of a probe card and a probe stylus according to the fifth embodiment, showing another example of the connection between them.

FIG. 19 shows a different connection of the probe card and the probe stylus according to the fifth embodiment. FIG. 19 shows a detailed cross sectional view of the part J framed by a broken line in FIG. 17. Referring to FIG. 19, wiring 36 is fixed to the second substrate 33 through a first and second single contactors 41, 42. A spring 43 is disposed between the hole of the second substrate and each of the first and second single contactors 41, 42. The structure of the other elements is similar to that of elements referred by the same reference numeral in FIG. 18.

The function of the probe stylus according to the fifth embodiment is identical to that of the first embodiment. And the advantage of the probe stylus according to the fifth embodiment is similar to that of third embodiment.

SIXTH EMBODIMENT

In a probe stylus according to the fifth embodiment, the first and second electrically conductive members 22, 23 are connected at their tip. On the other hand, in a probe stylus according to the sixth embodiment of the present invention, the first and second electrically conductive members 22, 23 are not connected at their tip. And at an inspection of a semiconductor device, they are connected to each other through a pad disposed in a semiconductor device. The other feature is similar to that of the fifth embodiment.

Figure 20:
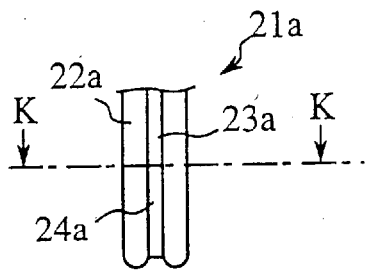
FIG. 20 is a schematic side view of a probe stylus as a sixth embodiment of the present invention.
Figure 21:
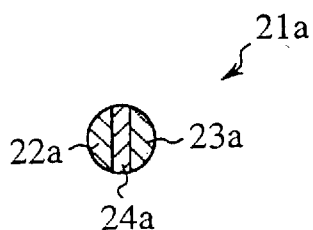
FIG. 21 is a cross sectional view of the probe stylus along K—K line in FIG. 20.

FIG. 20 shows that the probe stylus 21a is contacting with a pad 5 disposed in a semiconductor device. Referring to the figure, reference numerals 21a, 22a, 23a denote a probe stylus, a first electrically conductive member, and a second electrically conductive member, respectively. The first and second electrically conductive members 22a, 23a are connected by an insulating member 24a arranged between them. Reference numeral 5 denotes a pad disposed in a semiconductor.

The structure of a probe card having probe styluses 21a according to the sixth embodiment is similar to that of probe card shown in FIG. 17. The structure of the connecting part of a probe card and a probe stylus 21a according to the sixth embodiment is similar to that of shown in FIGS. 18, 19.

The function of the probe stylus according to the sixth embodiment is similar to that of the second embodiment of the present invention.

And the advantage of the probe stylus according to the sixth embodiment is similar to that of fourth embodiment.

SEVENTH EMBODIMENT

Figure 22:
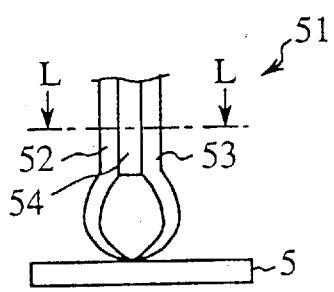
FIG. 22 is a schematic side view of a probe stylus as a seventh embodiment of present invention.
Figure 23:
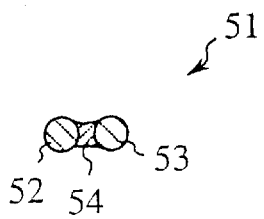
FIG. 23 is a cross sectional view of the probe stylus along L—L line in FIG. 22.

FIG. 22 shows that the probe stylus 51 is contacting with a pad 5 disposed in a semiconductor device. Referring to the figure, reference numerals 51, 52, 53 denote a probe stylus, a first electrically conductive member, and a second electrically conductive member, respectively. The first and second electrically conductive members 52, 53 are connected by an insulating member 54 arranged between them. Reference numeral 5 denotes a pad disposed in a semiconductor.

The probe stylus 51 of the seventh embodiment of the present invention is a so-called perpendicular type probe stylus. Each of the first and second electrically conductive members 52, 53 has a form of needle. The cross section perpendicular to the longitudinal direction of the needle is half round. Namely, each of the first and second electrically conductive member has a form of a conventional perpendicular type probe stylus divided equally along its longitudinal axis. Thus, the assembly of the probe stylus of the seventh embodiment has a diameter substantially equal to the conventional probe stylus. The first and second electrically conductive members 52, 53 are connected to each other at their tip, where the probe stylus 1 contacts with a pad 5 disposed in the semiconductor device. A probe stylus according to the seventh embodiment of the present invention has a circular resilient portion at the tip portion of the first and second electrically conductive members 52, 53, with which the probe stylus 1 contacts with a pad 5 disposed in a semiconductor device.

The structure of a probe card having probe styluses 51 according to the seventh embodiment is similar to that of probe card shown in FIG. 17. The structure of the connecting part of a probe card and a probe stylus 51 according to the seventh embodiment is similar to that of shown in FIGS. 18, 19.

The function of the probe stylus according to the seventh embodiment is similar to that of the first embodiment of the present invention.

As explained, the probe stylus 51 according to the seventh embodiment of the present invention has a first electrically conductive member 52 and a second electrically conductive member 53. Therefore, the probe stylus functions equivalent to two probe styluses in the prior art. As a result, by contacting one probe stylus to each pad disposed in a semiconductor device, it is possible to eliminate so-called dead band in the comparator in a precise inspection of a semiconductor device at a wafer state, or in an inspection of an I/O of a semiconductor device at a wafer state. Also in a case that a large number of pads are disposed in a semiconductor device, corresponding large number of probe styluses can be disposed on a probe card, so that so-called dead band in the comparator can be eliminated in a precise inspection of a semiconductor device at a wafer state, or in an inspection of an I/O of a semiconductor device at a wafer state.

A probe stylus according to the seventh embodiment of the present invention functions equivalently to two probe stylus in the prior art, hence, the number of probe styluses 51 to be attached to a probe card and/or the area required for the arrangement of the probe stylus in a probe card can be reduced, as a result, the fabrication cost can be reduced.

Because the probe stylus 51 according to the seventh embodiment is a so-called perpendicular type probe stylus, a force urges the first and second electrically conductive members 52, 53 equally, when the probe stylus 51 contacts with a pad 5 disposed in a semiconductor. As a result, the structural reliability of the probe stylus 51 is improved.

In a probe stylus according to the seventh embodiment of the present invention, a circular resilient portion is formed at the tip portion of the first and second electrically conductive members 52,53, with which the probe stylus 51 contacts with a pad 5 disposed in the semiconductor device. As a result, the impact at the contact of the probe stylus and the pad disposed in the semiconductor is absorbed by the circular resilient portion. Therefore, a warp of a probe card, which may be caused by the contact of the probe styluses and the pads, can be avoided.

According to the seventh embodiment of the present invention, each of the first and second electrically conductive members 52, 53 has a round cross section perpendicular to the longitudinal direction. And the diameter of each of the first and second electrically conductive members is equal to that of a probe stylus in the prior art. Therefore, a current capacity of an electrically conductive member for forcing can be assured to be equal to that of probe stylus for forcing in the prior art, when any one of the first and second electrically conductive members 52, 53 is used as an electrically conductive member for forcing at a precise inspection of I/O of a semiconductor device.

EIGHTH EMBODIMENT

In a probe stylus according to the seventh embodiment, the first and second electrically conductive members 52, 53 are connected at their tip. On the other hand, in a probe stylus according to the eighth embodiment of the present invention, the first and second electrically conductive members are not connected at their tip. And at an inspection of a semiconductor device, they are connected to each other through a pad disposed in the semiconductor device. The other feature is similar to that of the first embodiment.

Figure 24:
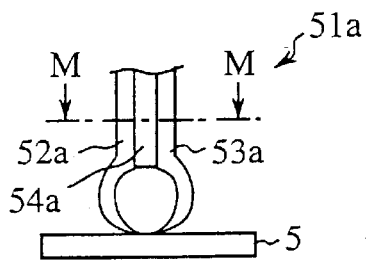
FIG. 24 is a schematic side view of a probe stylus as an eighth embodiment of the present invention.
Figure 25:
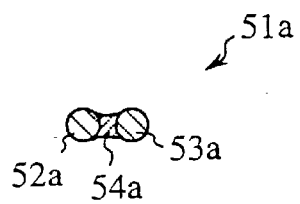
FIG. 25 is a cross sectional view of the probe stylus along M—M line in FIG. 24.

FIG. 24 shows that the probe stylus 51a is contacting with a pad 5 disposed in a semiconductor device. Referring to the figures, reference numerals 51a, 52a, 53a denote a probe stylus, a first electrically conductive member, and a second electrically conductive member, respectively. The first and second electrically conductive members 52a, 53a are connected by an insulating member 54a arranged between them. Reference numeral 5 denotes a pad disposed in a semiconductor.

The structure of a probe card having probe stylus 51a according to the eighth embodiment is similar to that of the probe card shown in FIG. 17. The connection between a probe stylus 51a and the substrate of a probe card is similar to that shown in FIGS. 18, 19. The function of the probe stylus and the probe card is similar to that of the second embodiment.

As explained, in the probe stylus according to the eighth embodiment, the first and second electrically conductive members 52a, 53a contact electrically to each other through a pad 5 disposed in a semiconductor at an inspection of a semiconductor device. Therefore, the value of voltage and/or electric current can be compensated up to the pad 5, at a precise inspection of a semiconductor device at a wafer state. And a line for driver and a line for comparator are assured up to the pad 5, at an inspection of an I/O of a semiconductor device at a wafer state. As a result, a higher precision inspection of a semiconductor device becomes possible. A probe stylus according to the eighth embodiment has similar advantages to that of a probe stylus according to the seventh embodiment.

NINTH EMBODIMENT

In a probe stylus according to the seventh embodiment, the cross section perpendicular to the longitudinal direction of the electrically conductive members 52, 53 is round. On the other hand, the cross section perpendicular to the longitudinal direction of a first and second electrically conductive members of a probe stylus according to the ninth embodiment is half round. Namely, each of the first and second electrically conductive member has a form of an electrically conductive member divided equally along its longitudinal axis. The other feature is similar to that of the seventh embodiment.

Figure 26:
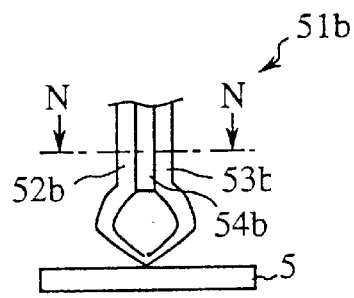
FIG. 26 is a schematic side view of a probe stylus as a ninth embodiment of present invention.
Figure 27:
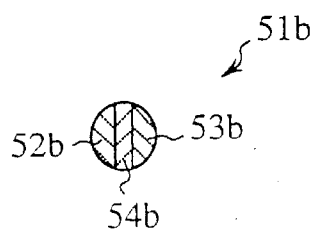
FIG. 27 is a cross sectional view of the probe stylus along N—N line in FIG. 26.

FIG. 26 shows that the probe stylus 51a is contacting with a pad 5 disposed in a semiconductor device. Referring to the figure, reference numerals 51b, 52b, 53b denote a probe stylus, a first electrically conductive member, and a second electrically conductive member, respectively. The first and second electrically conductive members 52a, 53a are connected by an insulating member 54b arranged between them. Reference numeral 5 denotes a pad disposed in a semiconductor.

The structure of a probe card having probe stylus 51b according to the ninth embodiment is similar to that of the probe card shown in FIG. 17. The connection between a probe stylus 51b and the substrate of a probe card is similar to that shown in FIGS. 18, 19. The function of the probe stylus and the probe card is similar to that of the first embodiment.

As explained, the probe stylus 51b according to the ninth embodiment of the present invention has a first electrically conductive member 52b and a second electrically conductive member 53b. Therefore, the probe stylus 51b functions equivalently to two probe styluses in the prior art. As a result, by contacting one probe stylus to each pad disposed in the semiconductor device, it is possible to eliminate so-called dead band in the comparator in a precise inspection of a semiconductor device at a wafer state, or in an inspection of an I/O of a semiconductor device at a wafer state. Hence, in a case that a large number of pads are disposed in a semiconductor device, corresponding large number of probe styluses 51b can be disposed on a substrate of a probe card, so that so-called dead band in the comparator can be eliminated in a precise inspection of a semiconductor device at a wafer state, or in an inspection of an I/O of a semiconductor device at a wafer state.

Because the probe stylus 51b according to the ninth embodiment functions equivalently to two probe styluses in the prior art, the number of probe styluses 51b to be attached to a probe card and/or the area required for the arrangement of the probe stylus 51b in a probe card can be reduced. As a result, the fabrication cost can be reduced.

Additionally, according to the ninth embodiment of the present invention, each of the first and second electrically conductive members 52b, 53b has a half round cross section perpendicular to the longitudinal direction. Therefore, the thickness of the probe stylus according to the first embodiment is smaller than that of a bundle of two probe styluses of the prior art. As a result, also in a case that a large number of pads are disposed in a semiconductor device, a corresponding number of the probe styluses 51b can be attached onto a probe card.

Because the probe stylus 51b according to the ninth embodiment is a so-called perpendicular type probe stylus, a force urges the first and second electrically conductive members 52, 53 equally, when a probe stylus 51b contacts with a pad 5 disposed in a semiconductor As a result, the structural reliability of the probe stylus 51b is improved.

In a probe stylus according to the ninth embodiment of the present invention, a circular resilient portion is formed at the tip portion of the first and second electrically conductive members 52b, 53b, with which the probe stylus 51b contacts with a pad 5 disposed in the semiconductor device. As a result, the impact at the contact of the probe stylus and the pad disposed in the semiconductor is absorbed by the circular resilient portion. Therefore, a warp of a probe card, which may be caused by the contact of the probe styluses and the pads, can be avoided.

TENTH EMBODIMENT

In a probe stylus according to the ninth embodiment, the first and second electrically conductive members 52b, 53b are connected at their tip. On the other hand, in a probe stylus according to the tenth embodiment of the present invention, the first and second electrically conductive members are not connected at their tip. And at an inspection of a semiconductor device, they are connected to each other through a pad disposed in the semiconductor device. The other feature is similar to that of the ninth embodiment.

Figure 28:
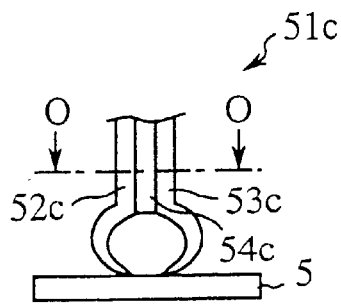
FIG. 28 is a schematic side view of a probe stylus as a tenth embodiment of the present invention.
Figure 29:
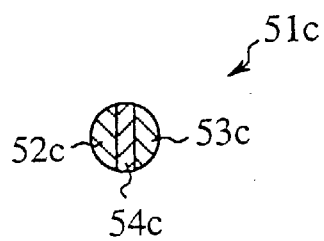
FIG. 29 is a cross sectional view of the probe stylus along O—O line in FIG. 28.

FIG. 28 shows that the probe stylus 51a is contacting with a pad 5 disposed in a semiconductor device. Referring to the figure, reference numerals 51c, 52c, 53c denote a probe stylus, a first electrically conductive member, and a second electrically conductive member, respectively. The first and second electrically conductive members 52c, 53c are connected by an insulating member 54c arranged between them. Reference numeral 5 denotes a pad disposed in a semiconductor.

The structure of a probe card having probe stylus 51c according to the tenth embodiment is similar to that of the probe card shown in FIG. 17. The connection between a probe stylus 51c and the substrate of a probe card is similar to that shown in FIGS. 18, 19. The function of the probe stylus and the probe card is similar to that of the second embodiment.

As explained, the first and second electrically conductive members 52c, 53c in the probe stylus according to the tenth embodiment contact electrically to each other through a pad 5 disposed in the semiconductor at an inspection of a semiconductor device. Therefore, the value of voltage and/or electric current can be compensated up to the pad 5, at a precise inspection of a semiconductor device at a wafer state. And a line for driver and a line for comparator are assured up to the pad 5, at an inspection of an I/O of a semiconductor device at a wafer state. As a result, a higher precision inspection of a semiconductor device becomes possible.

A probe stylus according to the tenth embodiment has similar advantages to that of a probe stylus according to the ninth embodiment.

ELEVENTH EMBODIMENT

Figure 30:
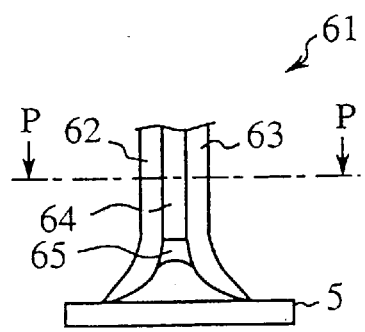
FIG. 30 is a schematic side view of a probe stylus as an eleventh embodiment of the present invention.
Figure 31:
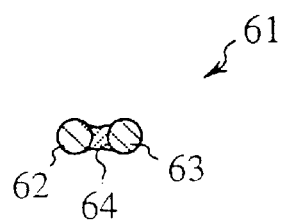
FIG. 31 is a cross sectional view of the probe stylus along P—P line in FIG. 30.

FIG. 30 shows that the probe stylus 61 is contacting with a pad 5 disposed in a semiconductor device. Referring to the figure, reference numerals 61, 62, 63 denote a probe stylus, a first electrically conductive member, and a second electrically conductive member, respectively. The first and second electrically conductive members 62, 63 are connected by an insulating member 64 arranged between them. Reference numeral 5 denotes a pad disposed in a semiconductor.

The probe stylus 61 of the eleventh embodiment of the present invention is a so-called perpendicular type probe stylus. Each of the first and second electrically conductive members 62, 63 has a form of needle. The cross section perpendicular to the longitudinal direction of the needle is round. Namely, each of the first and second electrically conductive member 62, 63 has a form of a conventional perpendicular type probe stylus.

A probe stylus according to the eleventh embodiment of the present invention has a Y-formed resilient portion at the tip portion of the first and second electrically conductive members 62,63, with which the probe stylus 61 contacts with a pad 5 disposed in a semiconductor device. The first and second electrically conductive members 6 are connected to each other through a third electrically conductive member 65, which is disposed between the tip of the electrically conductive members, where the probe stylus contacts with a pad disposed in a semiconductor device.

The structure of a probe card having probe stylus 61 according to the eleventh embodiment is similar to that of the probe card shown in FIG. 17. The connection between a probe stylus 61 and the substrate of a probe card is similar to that shown in FIGS. 18, 19. The function of the probe stylus and the probe card is similar to that of the second embodiment.

As explained, according to the eleventh embodiment, the tip portion of a probe stylus 61, where the probe stylus contacts with a pad disposed in a semiconductor device, is widened, therefore a probe stylus 61 contacts with a pad 5 at two points. As a result, the electric resistance at the contact between the probe stylus and the pad is small. A probe stylus according to the eleventh embodiment has advantages similar to that of the seventh embodiment.

TWELFTH EMBODIMENT

In a probe stylus according to the eleventh embodiment, the first and second electrically conductive members 62, 63 are connected through a third electrically conductive member 65 disposed at their tip. On the other hand, in a probe stylus according to the twelfth embodiment of the present invention, no such a third electrically conductive member for connecting the first and second electrically conductive members 62, 63 are disposed. And at an inspection of a semiconductor device, they are connected to each other through a pad disposed in the semiconductor device. The other feature is similar to that, of the eleventh embodiment.

Figure 32:
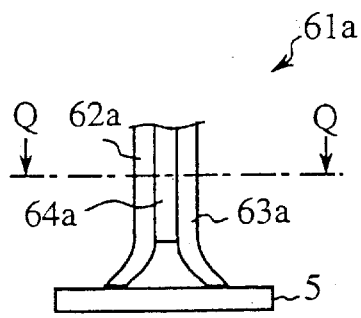
FIG. 32 is a schematic side view of a probe stylus as a twelfth embodiment of the present invention.
Figure 33:
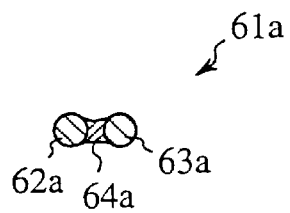
FIG. 33 is a cross sectional view of the probe stylus along Q—Q line in FIG. 32.

FIG. 32 shows that the probe stylus 61a is contacting with a pad 5 disposed in a semiconductor device. Referring to the figure, reference numerals 61a, 62a, 63a denote a probe stylus, a first electrically conductive member, and a second electrically conductive member, respectively. The first and second electrically conductive members 62a, 63a are connected by an insulating member 64a arranged between them. Reference numeral 5 denotes a pad disposed in a semiconductor.

The structure of a probe card having probe stylus 61a according to the twelfth embodiment is similar to that of the probe card shown in FIG. 17. The connection between a probe stylus 61a and the substrate of a probe card is similar to that shown in FIGS. 18, 19. The function of the probe stylus and the probe card is similar to that of the second embodiment.

As explained, according to the twelfth embodiment, the tip portion of a probe stylus 61a, where the probe stylus contacts with the pad disposed in a semiconductor device, is widened, therefore a probe stylus 61 contacts with a pad 5 at two points. As a result, the electric resistance at the contact between the probe stylus and the pad is small. A probe stylus according to the twelfth embodiment has advantages similar to that of the eighth embodiment.

THIRTEENTH EMBODIMENT

In a probe stylus according to the eleventh embodiment, the cross section perpendicular to the longitudinal direction of the electrically conductive members 52, 53 is round. On the other hand, the cross section perpendicular to the longitudinal direction of a first and second electrically conductive members of a probe stylus according to the thirteenth embodiment is half round. Namely, each of the first and second electrically conductive member has a form of a first and second electrically conductive members in the eleventh embodiment divided equally along its longitudinal axis. The other feature is similar to that of the seventh embodiment.

Figure 34:
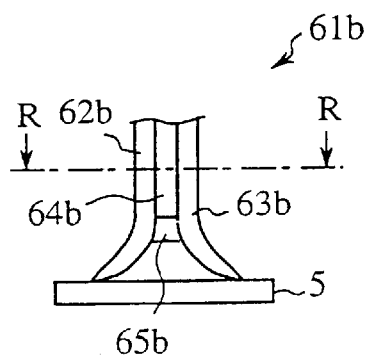
FIG. 34 is a schematic side view of a probe stylus as a thirteenth embodiment of the present invention.
Figure 35:
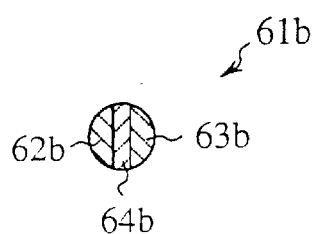
FIG. 35 is a cross sectional view of the probe stylus along R—R line in FIG. 34.

FIG. 34 shows that the probe stylus 61b is contacting with a pad 5 disposed in a semiconductor device. Referring to the figure, reference numerals 61b, 62b, 63b denote a probe stylus, a first electrically conductive member, and a second electrically conductive member, respectively. The first and second electrically conductive members 62a, 63a are connected by an insulating member 64b arranged between them. The firsts and second electrically conductive members 62b, 63b are electrically connected by a third electrically conductive member 65b. Reference numeral 5 denotes a pad disposed in a semiconductor.

The structure of a probe card having probe stylus 61b according to the thirteenth embodiment is similar to that of the probe card shown in FIG. 17. The connection between a probe stylus 61b and the substrate of a probe card is similar to that shown in FIGS. 18, 19. The function of the probe stylus and the probe card is similar to that of the first embodiment.

A probe stylus according to the thirteenth embodiment has advantages similar to that of the ninth embodiment.

FOURTEENTH EMBODIMENT

In a probe stylus according to the thirteenth embodiment, the first and second electrically conductive members 62b, 63b are connected through a third electrically conductive member 65b disposed near to their tip. On the other hand, in a probe stylus according to the fourteenth embodiment of the present invention, no such a third electrically conductive member for connecting the first and second electrically conductive members are disposed. And at an inspection of a semiconductor device, they are connected to each other through a pad disposed in a semiconductor device. The other feature is similar to that of the thirteenth embodiment.

Figure 36:
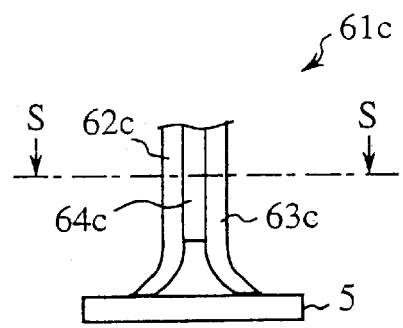
FIG. 36 is a schematic side view of a probe stylus as a fourteenth embodiment of e present invention.
Figure 37:
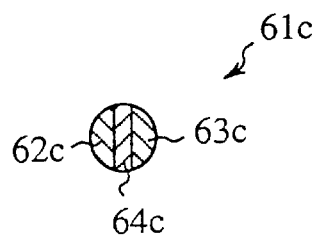
FIG. 37 is a cross sectional view of the probe stylus along S—S line in FIG. 36.

FIG. 36 shows that the probe stylus is contacting with a pad disposed in a semiconductor device. Referring to the figure, reference numerals 61c, 62c, 63c denote a probe stylus, a first electrically conductive member, and a second electrically conductive member, respectively. The first and second electrically conductive members 62a, 63a are connected by an insulating member 64c arranged between them. Reference numeral 5 denotes a pad disposed in a semiconductor.

The structure of a probe card having probe stylus 61c according to the fourteenth embodiment is similar to that of the probe card shown in FIG. 17. The connection between a probe stylus 61c and the substrate of a probe card is similar to that shown in FIGS. 18, 19. The function of the probe stylus and the probe card is similar to that of the second embodiment.

A probe stylus according to the fourteenth embodiment has advantages similar to that of the tenth embodiment.

FIFTEENTH EMBODIMENT

Figure 38:
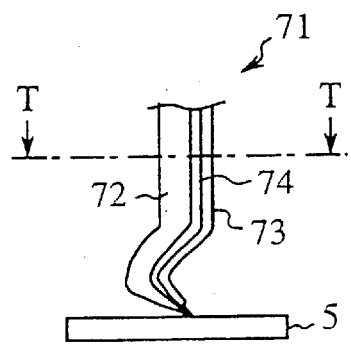
FIG. 38 is a schematic side view of a probe stylus as a fifteenth embodiment of the present invention.
Figure 39:
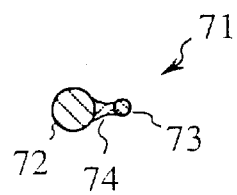
FIG. 39 is a cross sectional view of the probe stylus along T—T line in FIG. 38.

FIG. 38 shows that the probe stylus is contacting with a pad disposed in a semiconductor device. Referring to the figure, reference numerals 71, 72, 73 denote a probe stylus, a first electrically conductive member, and a second electrically conductive member, respectively. The first and second electrically conductive members 72, 73 are connected by an insulating member 74 arranged between them. Reference numeral 5 denotes a pad disposed in a semiconductor.

The probe stylus 71 of the fifteen embodiment of the present invention is a so-called perpendicular type probe stylus. Each of the first and second electrically conductive members 72, 73 has a form of needle. The cross section perpendicular to the longitudinal direction of the needle is round. In this embodiment, the diameter of the second electrically conductive member 72 is smaller than that of the first electrically conductive member 73. Namely, the assembly of the probe stylus of the fifteenth embodiment has a thickness substantially equal to the conventional probe stylus. A probe stylus according to the fifteenth embodiment of the present invention has an arc or jack-knifed resilient portion at the tip portion of the first and second electrically conductive members 72,73, with which the probe stylus contacts with a pad 5 disposed in a semiconductor device. The first and second electrically conductive members 72, 73 are connected to each other at their tip portion, where the probe stylus contacts with a pad 5 disposed in the semiconductor device.

The structure of a probe card having probe styluses 71 according to the fifteenth embodiment is similar to that of probe card shown in FIG. 17. The structure of the connecting part of a probe card and a probe stylus 71 according to the seventh embodiment is similar to that of shown in FIGS. 18, 19. The function of the probe stylus according to the fifteenth embodiment is similar to that of the first embodiment of the present invention.

As explained, the probe stylus 71 according to the fifteenth embodiment of the present invention has a first electrically conductive member 72 and a second electrically conductive member 73. Therefore, the probe stylus functions equivalent to two probe styluses in the prior art. As a result, by contacting one probe stylus to each pad disposed in the semiconductor device, it is possible to eliminate so-called dead band in the comparator in a precise inspection of a semiconductor device at a wafer state, or in an inspection of an I/O of a semiconductor device at a wafer state. Also in a case that a large number of pads are disposed in a semiconductor device, corresponding large number of probe styluses can be disposed on a probe card, so that so-called dead band in the comparator can be eliminated in a precise inspection of a semiconductor device at a wafer state, or in an inspection of an I/O of a semiconductor device at a wafer state.

A probe stylus according to the fifteenth embodiment of the present invention functions equivalently to two probe stylus in the prior art, hence, the number of probe styluses 71 to be attached to a probe card and/or the area required for the arrangement of the probe stylus in a probe card can be reduced, as a result, the fabrication cost can be reduced.

According to the fifteenth embodiment of the present invention, the diameter of the second electrically conductive member 73 is smaller than that of the first electrically conductive member 72. And the diameter of the probe stylus 71 is substantially equal to that of a probe stylus of the prior art. Therefore, the thickness of the probe stylus 71 according to the fifteenth embodiment is smaller than that of bundled two probe styluses in the prior art. As a result, also in a case that a large number of pads are disposed in a semiconductor device, a corresponding number of the probe styluses 1 can be attached onto a probe card.

In a probe stylus according to the fifteenth embodiment of the present invention, an arc or jack-knifed resilient portion is formed at the tip portion of the first and second electrically conductive members 72,73, with which the probe stylus 71 contacts with a pad 5 disposed in the semiconductor device. As a result, the impact at the contact of the probe stylus and the pad disposed in the semiconductor is absorbed by the resilient portion. Therefore, a warp of a probe card, which may be caused by the contact of the probe styluses and the pads, can be avoided.

According to the fifteenth embodiment, the first electrically conductive member 72 has a round cross section perpendicular to the longitudinal direction. And the diameter of the first electrically conductive members is substantially equal to that of a probe stylus in the prior art. Therefore, a current capacity of an electrically conductive member for forcing at a precise inspection of I/O of a semiconductor device at a wafer state can be assured to be equal to that of probe stylus for forcing in the prior art.

SIXTEENTH EMBODIMENT

In a probe stylus according to the fifteenth embodiment, the first and second electrically conductive members 72, 73 are connected to each other. On the other hand, in a probe stylus according to the sixteenth embodiment of the present invention, the first and second electrically conductive member are not connected to each other. And at an inspection of a semiconductor device, they are connected to each other through a pad disposed in a semiconductor device. The other feature is similar to that of the fifteenth embodiment.

Figure 40:
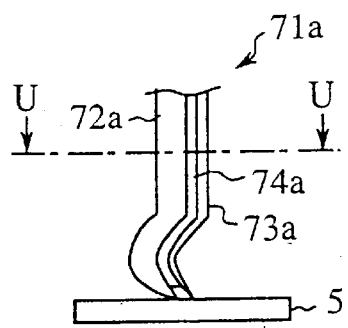
FIG. 40 is a schematic side view of a probe stylus as a sixteenth embodiment of the present invention.
Figure 41:
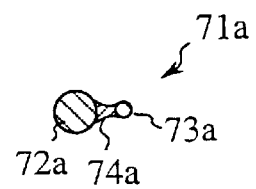
FIG. 41 is a cross sectional view of the probe stylus along U—U line in FIG. 40.

FIG. 40 shows that the probe stylus is contacting with a pad disposed in a semiconductor device. Referring to the figure, reference numerals 71c, 72c, 73c denote a probe stylus, a first electrically conductive member, and a second electrically conductive member, respectively. The first and second electrically conductive member 72a, 73a are connected by an insulating member 74a arranged between them. Reference numeral 5 denotes a pad disposed in a semiconductor.

The structure of a probe card having probe stylus 71c according to the sixteenth embodiment is similar to that of the probe card shown in FIG. 17. The connection between a probe stylus 71c and the substrate of a probe card is similar to that shown in FIGS. 18, 19. The function of the probe stylus and the probe card is similar to that of the second embodiment.

As explained, the first and second electrically conductive members 72a, 73a in the probe stylus according to the sixteenth embodiment contact electrically to each other through a pad 5 disposed in a semiconductor at an inspection of a semiconductor device. Therefore, the value of voltage and/or electric current can be compensated up to the pad 5, at a precise inspection of a semiconductor device at a wafer state. And a line for driver and a line for comparator are assured up to the pad 5, at an inspection of an I/O of a semiconductor device at a wafer state. As a result, a higher precision inspection of a semiconductor device becomes possible.

A probe stylus according to the sixteenth embodiment has advantages similar to that of the fifteenth embodiment.

SEVENTEENTH EMBODIMENT

Figure 42:
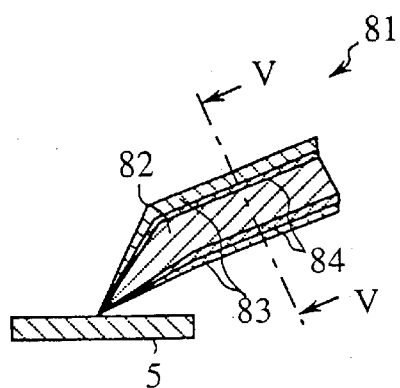
FIG. 42 is a schematic side view of a probe stylus as a seventeenth embodiment of the present invention.
Figure 43:
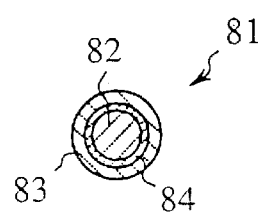
FIG. 43 is a cross sectional view of the probe stylus along V—V line in FIG. 42.

FIG. 42 shows that the probe stylus is contacting with a pad disposed in a semiconductor device. Referring to the figure, reference numerals 81, 82, 83 denote a probe stylus, a first electrically conductive member, and a second electrically conductive member, respectively. The first and second electrically conductive members 82, 83 are connected by an insulating member 84 arranged between them. Reference numeral 5 denotes a pad disposed in a semiconductor.

The probe stylus 81 of the seventeenth embodiment of the present invention is a so-called cantilever type probe stylus. The first electrically conductive members 82 has a form of needle. The cross section perpendicular to the longitudinal direction of the needle is round. The second electrically conductive member 83 has a form of cylinder covering the first electrically conductive member 82. In this embodiment, the first electrically conductive member 82 has a thickness equal to that of a cantilever type probe stylus in the prior art, and the outer side of the first electrically conductive member is covered with an insulating member 84. Further, the outside of the insulating member 84 is covered with the second electrically conductive member 83. Thus, the assembly of the probe stylus of the seventeenth embodiment has a thickness substantially equal to a cantilever type probe stylus in the prior art. The first and second electrically conductive members 82, 83 are connected to each other at their tip, where the probe stylus contacts with a pad disposed in a semiconductor device.

Figure 44:
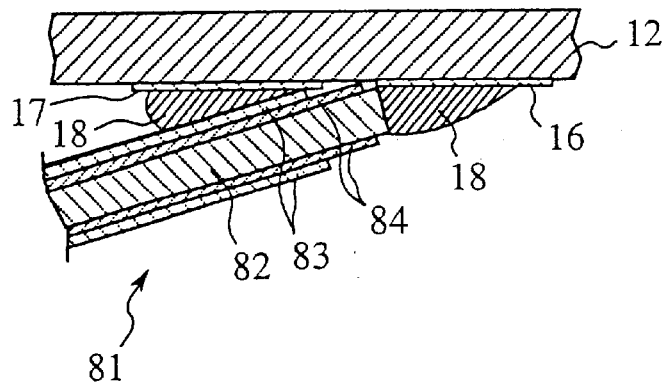
FIG. 44 is a cross sectional views of a connecting portion between a probe card a probe stylus according to the seventeenth embodiment of the present invention.

The structure of a probe card having probe stylus 81 according to the seventeenth embodiment is similar to that of the probe card shown in FIG. 4. FIG. 44 is a detailed cross sectional view of the connecting portion between the probe card and a probe stylus according to the seventeenth embodiment. FIG. 44 corresponds to FIG. 5. Each element in FIG. 44 corresponding to an element in FIG. 5 and/or 42 is referred by the same reference numeral. The function of the probe stylus and the probe card is similar to that of the first embodiment.

As explained, the probe stylus 81 according to the seventeenth embodiment of the present invention has a first electrically conductive member 82 and a second electrically conductive member 83. Therefore, such a probe stylus functions equivalent to two probe styluses in the prior art. As a result, by contacting one probe stylus to each pad disposed in the semiconductor device, it is possible to eliminate so-called dead band in the comparator in a precise inspection of a semiconductor device at a wafer state, or in an inspection of an I/O of a semiconductor device at a wafer state. Also in a case that a large number of pads are disposed in a semiconductor device, corresponding large number of probe styluses can be disposed on a probe card, so that so-called dead band in the comparator can be eliminated in a precise inspection of a semiconductor device at a wafer state, or in an inspection of an I/O of a semiconductor device at a wafer state.

A probe stylus according to the seventeenth embodiment of the present invention functions equivalently to two probe stylus in the prior art, hence, the number of probe styluses 81 to be attached to a probe card and/or the area required for the arrangement of the probe stylus in a probe card can be reduced, as a result, the fabrication cost can be reduced.

In this embodiment, the assembly of the probe stylus of the seventeenth embodiment has a thickness substantially equal to a cantilever type probe stylus in the prior art. Therefore, the thickness of the probe stylus 81 according to the seventeenth embodiment is smaller than that of bundled two probe styluses in the prior art. As a result, also in a case that a large number of pads are disposed in a semiconductor device, a corresponding number of the probe styluses 81 can be attached onto a probe card.

According to the seventeenth embodiment of the present invention, the first electrically conductive members 82 has a round cross section perpendicular to the longitudinal direction. And the diameter of the first electrically conductive members is substantially equal to that of a probe stylus in the prior art. Therefore, a current capacity of an electrically conductive member for forcing can be assured to be equal to that of probe stylus for forcing in the prior art, when the first electrically conductive members 82 is used as an electrically conductive member for forcing at a precise inspection of I/O of a semiconductor device at a wafer state.

According to the seventeenth embodiment, the first electrically conductive member 82 is covered with an insulating member 84, and the insulating member 84, in turn, is covered with the second electrically conductive member 83. Therefore, when the first electrically conductive member 82 is used for sensing, the electrically conductive member for sensing can be protected from external noises.

EIGHTEENTH EMBODIMENT

In a probe stylus according to the seventeenth embodiment, the first and second electrically conductive members 82, 83 are connected at their tip. On the other hand, in a probe stylus according to the eighteenth embodiment of the present invention, the first and second electrically conductive members are not connected at their tip. And at an inspection of a semiconductor device, they are connected to each other through a pad disposed in the semiconductor device. The other feature is similar to that of the seventeenth embodiment.

Figure 45:
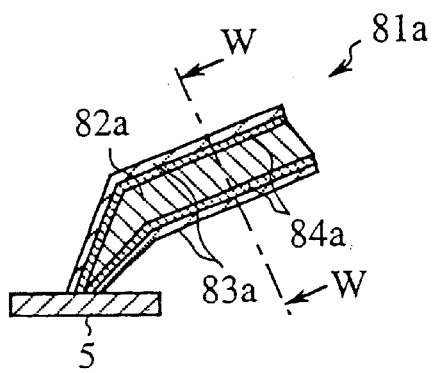
FIG. 45 is a schematic side view of a probe stylus as a eighteenth embodiment of the present invention.
Figure 46:
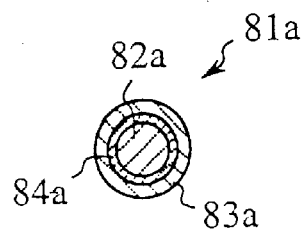
FIG. 46 is a cross sectional view of the probe stylus along W—W line in FIG. 45.

FIG. 45 shows that the probe stylus is contacting with a pad disposed in a semiconductor device. Referring to the figure, reference numerals 81a, 82a, 83a denote a probe stylus, a first electrically conductive member, and a second electrically conductive member, respectively. The first and second electrically conductive members 82a, 83a are connected by an insulating member 84a arranged between them. Reference numeral 5 denotes a pad disposed in a semiconductor.

The structure of a probe card having probe stylus 81a according to the eighteenth embodiment is similar to that of the probe card shown in FIG. 4. The connection between a probe stylus 81a and the substrate of a probe card is similar to that shown in FIG. 44 The function of the probe card and the probe stylus is similar to that of the second embodiment.

As explained, the first and second electrically conductive members 82a, 83a in the probe stylus according to the eighteenth embodiment contact electrically to each other through a pad 5 disposed in the semiconductor at an inspection of a semiconductor device. Therefore, the value of voltage and/or electric current can be compensated up to the pad 5, at a precise inspection of a semiconductor device at a wafer state. And a line for driver and a line for comparator are assured up to the pad 5; at an inspection of an I/O of a semiconductor device at a wafer state. As a result, a higher precision inspection of a semiconductor device becomes possible.

A probe stylus according to the eighteenth embodiment has advantages similar to that of the seventeenth embodiment.

NINETEENTH EMBODIMENT

Figure 47:
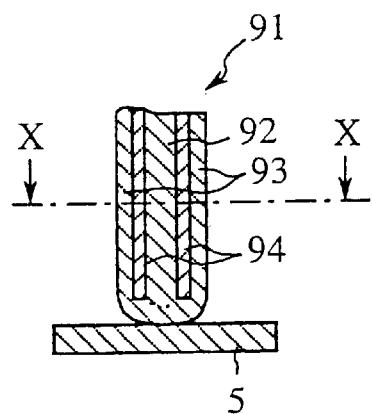
FIG. 47 is a schematic side view of a probe stylus as a nineteenth embodiment o the present invention.
Figure 48:
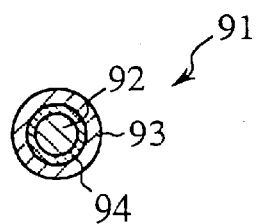
FIG. 48 is a cross sectional view of the probe stylus along X—X line in FIG. 47.

FIG. 47 shows that the probe stylus is contacting with a pad disposed in a semiconductor device. Referring to the figure, reference numerals 91, 92, 93 denote a probe stylus, a first electrically conductive member, and a second electrically conductive member, respectively. The first and second electrically conductive members 92, 93 are connected by an insulating member 94 arranged between them. Reference numeral 5 denotes a pad disposed in a semiconductor.

The probe stylus 91 of the nineteenth embodiment of the present invention is a so-called perpendicular type probe stylus. The first electrically conductive members 92 has a form of needle and its cross section perpendicular to the longitudinal direction of the needle is round. The second electrically conductive member 93 has a form of a cylinder, and covers the first electrically conductive member 92. In this embodiment, the first electrically conductive member 92 has a thickness substantially equal to that of a perpendicular type probe stylus in the prior art, and the outer side of the first electrically conductive member is covered with an insulating member 94. Further, the outside of the insulating member 94 is covered with the second electrically conductive member 93. Thus, the assembly of the probe stylus of the nineteenth embodiment has a thickness substantially equal to a perpendicular type probe stylus in the prior art. The first and second electrically conductive members 92, 93 are connected to each other at their tip portion, where the probe stylus contacts with a pad 5 disposed in a semiconductor device.

The structure of a probe card having probe stylus 91 according to the nineteenth embodiment is similar to that of the probe card shown in FIG. 17.

Figure 49:
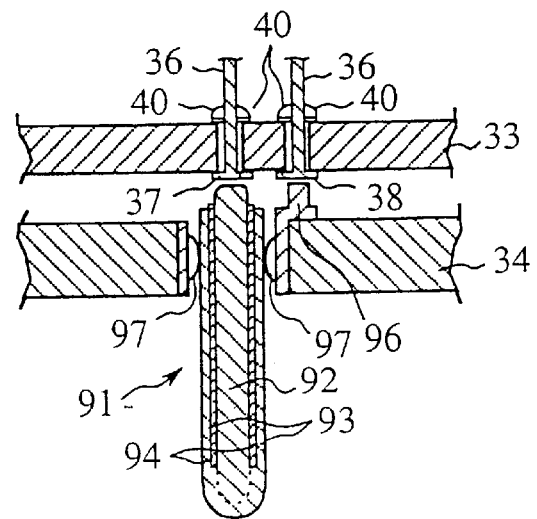
FIG. 49 is a detailed cross sectional view of an example of the connecting portion between the probe card and a substrate of a probe stylus according to the nineteenth embodiment.

FIG. 49 is a detailed cross sectional view of an example of the connecting portion between the probe card and a substrate of a probe stylus 91 according to the nineteenth embodiment. FIG. 49 corresponds to FIG. 18. In the figure, reference numeral 96 denotes a electrically conductive boss. And reference numeral 97 denotes a spring. The other element corresponding to an element in FIG. 47 is referred by the same reference numeral.

Figure 50:
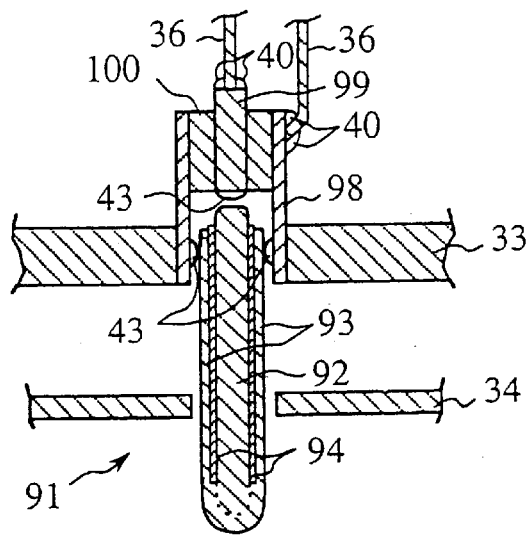
FIG. 50 is a detailed cross sectional view of another example of the connecting portion between the probe card and a substrate of a probe stylus according to the nineteenth embodiment.

FIG. 50 is a detailed cross sectional view of another example of the connecting portion between the probe card and a substrate of a probe stylus 91 according to the nineteenth embodiment. FIG. 50 corresponds to FIG. 19. In the figure, reference numerals 98, 99, and 100 denote a contacter, a electrically conductive bar and an insulating member, respectively. The other element corresponding to an element in FIG. 49 is referred by the same reference numeral. The function of the probe stylus and the probe card is similar to that of the first embodiment. The probe stylus according to the nineteenth embodiment has advantages similar to that of the seventeenth embodiment.

TWENTIETH EMBODIMENT

In a probe stylus according to the nineteenth embodiment, the first and second electrically conductive members 92, 93 are connected at their tip. On the other hand, in a probe stylus according to the twentieth embodiment of the present invention, the first and second electrically conductive members are not connected at their tip. And at an inspection of a semiconductor device, they are connected to each other through a pad disposed in the semiconductor device. The other feature is similar to that of the nineteenth embodiment.

Figure 51:
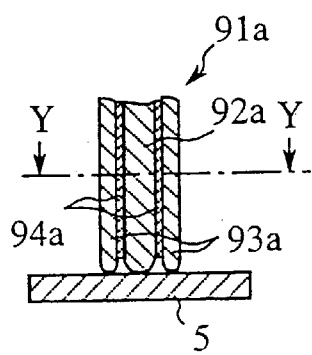
FIG. 51 is a schematic side view of a probe stylus as a twentieth embodiment of the present invention.
Figure 52:
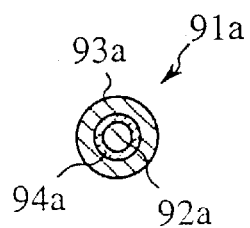
FIG. 52 is a cross sectional view of the probe stylus along Y—Y line in FIG. 51.

FIG. 51 shows that the probe stylus is contacting with a pad disposed in a semiconductor device. Referring to the figure, reference numerals 91a, 92a, 93a denote a probe stylus, a first electrically conductive member, and a second electrically conductive member, respectively. The first and second electrically conductive members 92a, 93a are connected by an insulating member 94a arranged between them. Reference numeral 5 denotes a pad disposed in a semiconductor.

The structure of a probe card having probe stylus 91a according to the twentieth embodiment is similar to that of the probe card shown in FIG. 17. The connection between a probe stylus 91a and the substrate of a probe card is similar to that shown in FIG. 49 and 50. The function of the probe card and the probe stylus is similar to that of the second embodiment. The probe stylus according to the twentieth embodiment has advantages similar to that of the eighteenth embodiment.

TWENTY-FIRST EMBODIMENT

Figure 53:
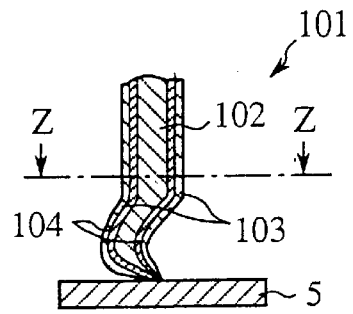
FIG. 53 is a schematic side view of a probe stylus as a twenty-first embodiment of e present invention.
Figure 54:
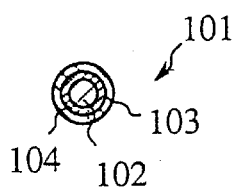
FIG. 54 is a cross sectional view of the probe stylus along Z—Z line in FIG. 53.

FIG. 53 shows that the probe stylus is contacting with a pad disposed in a semiconductor device. Referring to the figure, reference numerals 101, 102, 103 denote a probe stylus, a first electrically conductive member, and a second electrically conductive member, respectively. The first and second electrically conductive members 102, 103 are connected by an insulating member 104 arranged between them. Reference numeral 5 denotes a pad disposed in a semiconductor.

The probe stylus 101 of the twenty-first embodiment of the present invention is a so-called perpendicular type probe stylus. The first electrically conductive members 102 has a form of needle and its cross section perpendicular to the longitudinal direction of the needle is round. The second electrically conductive member 103 has a form of cylinder, and covers the first electrically conductive member 102. In this embodiment, the first electrically conductive member 102 has a thickness equal to that of a perpendicular type probe stylus in the prior art, and the outer side of the first electrically conductive member is covered with an insulating member 104. Further, the outside of the insulating member 104 is covered with the second electrically conductive member 103. Thus, the assembly of the probe stylus of the twenty-first embodiment has a thickness substantially equal to a perpendicular type probe stylus in the prior art.

A probe stylus 101 according to the twenty-first embodiment of the present invention has an arc or jack-knifed resilient portion at the tip portion of the first and second electrically conductive members 102, 103, with which the probe stylus 101 contacts with a pad 5 disposed in the semiconductor device. The first and second electrically conductive members 102, 103 are connected to each other at their tip, where the probe stylus 101 contacts with a pad 5 disposed in the semiconductor device.

The structure of a probe card having probe stylus 101 according to the twenty-first embodiment is similar to that of the probe card shown in FIG. 17. The connection between a probe stylus 101 and the substrate of a probe card is similar to that shown in FIG. 49 and 50. The function of the probe card and the probe stylus is similar to that of the first embodiment.

In a probe stylus according to the twenty-first embodiment of the present invention, an arc or jack-knifed resilient portion is formed at the tip portion of the first and second electrically conductive members 102, 103, with which the probe stylus contacts with a pad 5, which is disposed in a semiconductor device. As a result, the impact at the contact of the probe stylus and the pad disposed in the semiconductor is absorbed by the resilient portion. Therefore, a warp of a probe card, which may be caused by the contact of the probe styluses and the pads, can be avoided. The probe stylus according to the twenty-first embodiment has advantages similar to that of the seventeenth embodiment.

TWENTY-SECOND EMBODIMENT

In a probe stylus according to the twenty-first embodiment, the first and second electrically conductive members, 102, 103 are connected at their tip. On the other hand, in a probe stylus according to the twenty-second embodiment of the present invention, the first and second electrically conductive members are not connected at their tip. And at an inspection of a semiconductor device, they are connected to each other through a pad disposed in a semiconductor device. The other feature is similar to that of the twenty-first embodiment.

Figure 55:
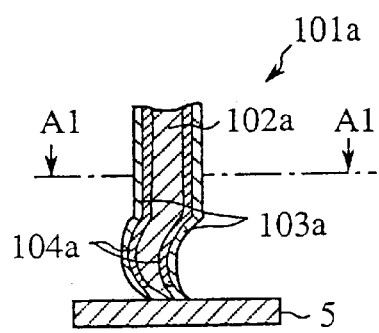
FIG. 55 is a schematic side view of a probe stylus as a twenty-second embodiment of the present invention.
Figure 56:
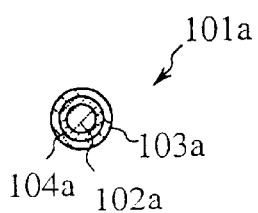
FIG. 56 is a cross sectional view of the probe stylus along A1—A1 line in FIG. 55.

FIG. 55 shows that the probe stylus is contacting with a pad disposed in a semiconductor device. Referring to the figure, reference numerals 101a, 102a, 103a denote a probe stylus, a first electrically conductive member, and a second electrically conductive member, respectively. The first and second electrically conductive members 102a, 103a are connected by an insulating member 104a arranged between them. Reference numeral 5 denotes a pad disposed in a semiconductor.

The structure of a probe card having probe stylus 101a according to the twenty-second embodiment is similar to that of the probe card shown in FIG. 17. The connection between a probe stylus 101a and the substrate of a probe card is similar to that shown in FIG. 49, 50. The function of the probe card and the probe stylus is similar to that of the second embodiment.

In a probe stylus according to the twenty-second embodiment of the present invention, an arc or jack-knifed resilient portion is formed at the tip portion of the first and second electrically conductive members 102a, 103a, with which the probe stylus contacts with a pad 5, which is disposed in a semiconductor device. As a result, the impact at the contact of the probe stylus and the pad disposed in the semiconductor is absorbed by the resilient portion. Therefore, a warp of a probe card, which may be caused by the contact of the probe styluses 101a and the pads, can be avoided. The probe stylus according to the twenty-second embodiment has advantages similar to that of the eighteenth embodiment.

TWENTY-THIRD EMBODIMENT

Figure 57:
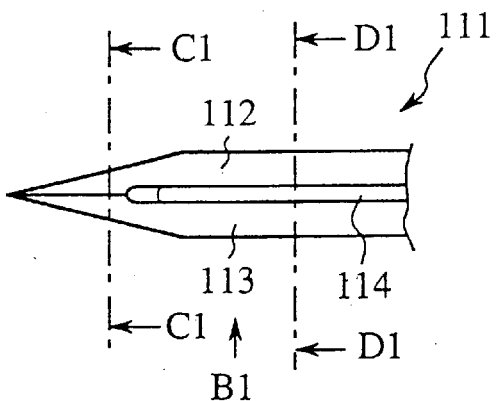
FIG. 57 is a schematic plan view of a probe stylus according to the twenty-third embodiment at a state that the probe stylus is not contacting with a pad disposed in a semiconductor.
Figure 58:
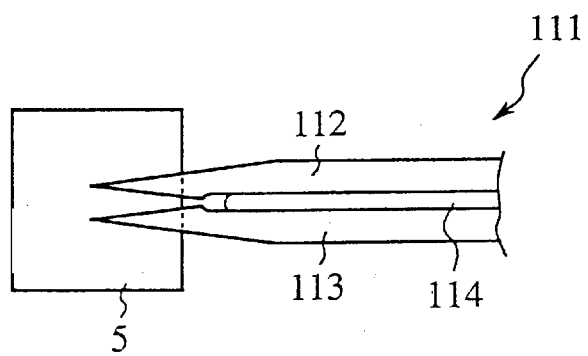
FIG. 58 is a schematic plan view of a probe stylus according to the twenty-third embodiment at a state that the probe stylus is contacting with a pad disposed in a semiconductor.
Figure 59:
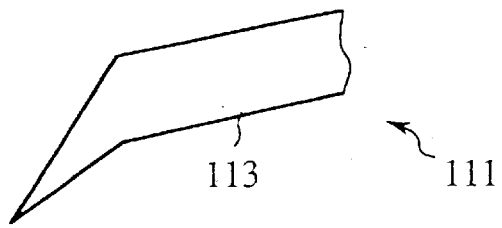
FIG. 59 is a side view of a probe stylus seen from the side B1 in FIG. 57.
Figure 60A:
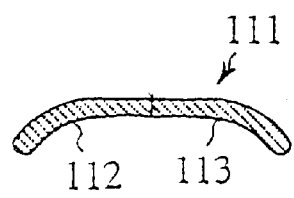
FIG. 60 is a cross sectional view of an example of a probe stylus, (*a*) shows a cross section along the line C1—C1 in FIG. 57, (*b*) shows a cross section along the line D1—D1 in FIG. 57.
Figure 60B:
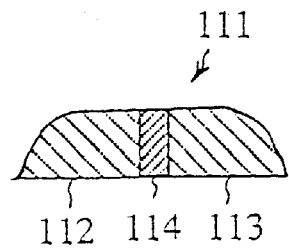
Figure 61A:
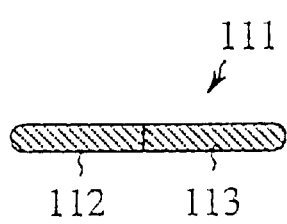
FIG. 61 is a cross sectional view of another example of a probe stylus, which has a form different from that of FIG. 60, (*a*) shows a cross section along the line C1—C1 in FIG. 57, (*b*) shows a cross section along the line D1—D1 in FIG. 57.
Figure 61B:
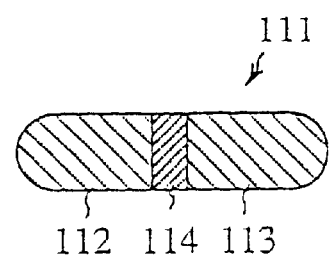
Figure 62:
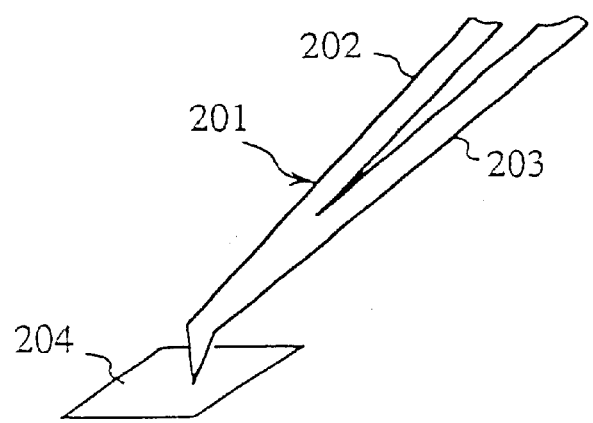
FIG. 62 is a perspective view of a probe stylus disclosed in JP-A-5-144895.
Figure 63:
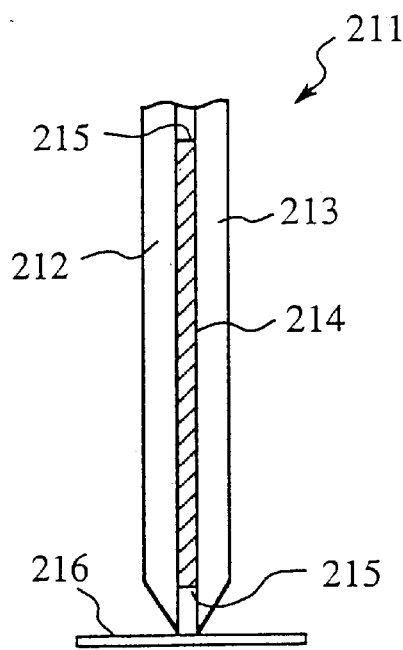
FIG. 63 is a cross sectional view of a probe stylus disclosed in JP-Utility-Model-A-5-144895.
Figure 64:
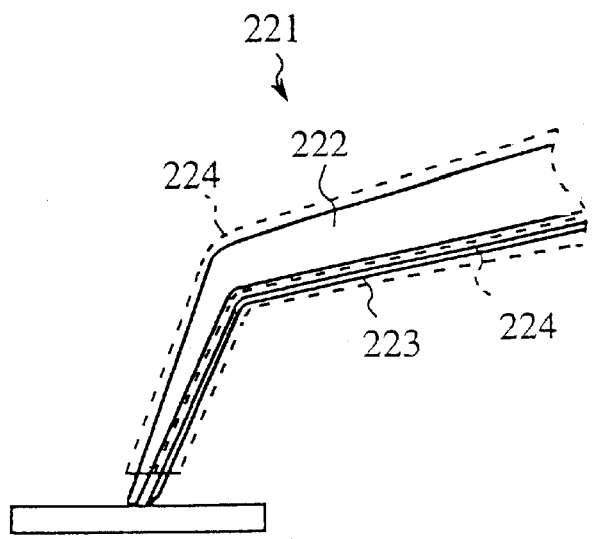
FIG. 64 is a cross sectional view of a probe stylus disclosed in JP-Utility-Model-A-61-104380.

FIG. 57, 58 are schematic plan views of a probe stylus according to the twenty-third embodiment. FIG. 57 shows a state that the probe stylus is not contacting with a pad disposed in a semiconductor. And FIG. 58 shows a state that the probe stylus is contacting with a pad disposed in a semiconductor. FIG. 59 is a side view of a probe stylus seen from the side B1 in FIG. 57. FIG. 60 is a cross sectional view of an example of a probe stylus. FIG. 60(a) shows a cross section along the line C1—C1 in FIG. 57. FIG. 60(b) shows a cross section along the line D1—D1 in FIG. 57. FIG. 61 is a cross sectional view of another example of a probe stylus, which has a form different from that of FIG. 60. FIG. 61(a) shows a cross section along the line C1—C1 in FIG. 57. FIG. 61(b) shows a cross section along the line D1—D1 in FIG. 57.

Referring to the figures, reference numerals 111, 112, 113 denote a probe stylus, a first electrically conductive member, and a second electrically conductive member, respectively. The first and second electrically conductive members 112, 113 are connected by an insulating member 114 arranged between them. Reference numeral 5 denotes a pad disposed in a semiconductor.

A probe stylus according to the twenty third embodiment of the present invention is a so-called cantilever type probe stylus. The first and second electrically conductive members 112, 113 have a form of needle. Their cross section perpendicular to their longitudinal direction are an arc as shown in FIGS. 60(*a*), (*b*) or a quadrate as shown in FIGS. 61(*a*), (*b*). The nearer to their tip, where the probe stylus contacts with a pad 5 disposed in a semiconductor device, the thinner their thickness is. According to the twenty-third embodiment, a slit is disposed in the tip portion of the probe stylus, where the probe stylus contacts with a pad disposed in a semiconductor stylus. When the probe stylus does not contact with a pad 5, the slit closes so that the first and second electrically conductive members 112, 113 contact to each other. On the other hand, when the probe stylus contacts with a pad 5, the slit opens so that the first and second electrically conductive members 112, 113 separate from each other.

The structure of a probe card having probe stylus 111 according to the twenty-third embodiment is similar to that of the probe card shown in FIG. 4. The connection between a probe stylus 111 and the substrate of a probe card is similar to that shown in FIG. 12. The function of the probe card and the probe stylus is similar to that of the second embodiment.

As explained, the probe stylus 1 according to the twenty-third embodiment of the present invention has a first electrically conductive member 112 and a second electrically conductive member 113. Therefore, such a probe stylus functions equivalent to two probe styluses in the prior art. As a result, by contacting one probe stylus to each pad disposed in the semiconductor device, it is possible to eliminate so-called dead band in the comparator in a precise inspection of a semiconductor device at a wafer state, or in an inspection of an I/O of a semiconductor device at a wafer state. Also in a case that a large number of pads are disposed in a semiconductor device, corresponding large number of probe styluses can be disposed on a probe card, so that so-called dead band in the comparator can be eliminated in a precise inspection of a semiconductor device at a wafer state, or in an inspection of an I/O of a semiconductor device at a wafer state.

A probe stylus according to the twenty-third embodiment of the present invention functions equivalently to two probe stylus in the prior art, hence, the number of probe styluses 111 to be attached to a probe card and/or the area required for the arrangement of the probe stylus in a probe card can be reduced, as a result, the fabrication cost can be reduced.

Because the first and second electrically conductive members 112, 113 of the probe stylus according to the twenty-third embodiment are arranged side by side, a force urges them equally, when the probe stylus 111 contacts with a pad 5 disposed in a semiconductor. As a result, the structural reliability of the probe stylus is improved.

In a probe stylus according to the twenty-third embodiment of the present invention, a slit is disposed between the tip portion of the first and second electrically conductive members 112,113, with which the probe stylus 111 contacts with a pad 5 disposed in the semiconductor device. As a result, the impact at the contact of the probe stylus 111 and the pad 5 disposed in the semiconductor is absorbed by the slit portion. Therefore, a warp of a probe card, which may be caused by the contact of the probe styluses and the pads, can be avoided.

The first and second electrically conductive members 112, 113 in the probe stylus 111 according to the twenty-third embodiment separate from each other, when the probe stylus 111 contacts with a pad 5 disposed in a semiconductor. Therefore, the value of voltage and/or electric current can be compensated up to the pad 5, at a precise inspection of a semiconductor device at a wafer state. And a line for driver and a line for comparator are assured up to the pad 5, at an inspection of an I/O of a semiconductor device at a wafer state. As a result, a higher precision inspection of a semiconductor device becomes possible.

What is claimed is:

1. A probe stylus for inspecting a semiconductor device, which contacts a pad disposed in a semiconductor device during an inspection of the semiconductor device, wherein the probe stylus comprises:

a first electrically conductive member formed as a needle, a second electrically conductive member formed as a needle, and an insulating member arranged between the first electrically conductive member and the second electrically conductive member and connecting them so that the first and second electrically conductive members and the insulating member form a single needle, wherein the first electrically conductive member is covered with the insulating member, and the insulating member is covered with the second electrically conductive member, and the first and second electrically conductive members are electrically connected to each other at their tip portion.

2. A probe stylus for inspecting a semiconductor device, which contacts a pad disposed in a semiconductor device during an inspection of the semiconductor device, wherein the probe stylus comprises:

a first electrically conductive member formed as a needle, a second electrically conductive member formed as a needle, and an insulating member arranged between the first electrically conductive member and the second electrically conductive member and connecting them so that the first and second electrically conductive members and the insulating member form a single needle, wherein the first electrically conductive member is covered with the insulating member, and the insulating member is covered with the second electrically conductive member, and the first and second electrically conductive members are not electrically connected to each other at their tip portion, but are connected to each other through a pad disposed in a semiconductor device at an inspection of the semiconductor device.

* * * * *